(12) United States Patent
Juergensen et al.

(10) Patent No.: US 7,762,208 B2
(45) Date of Patent: Jul. 27, 2010

(54) LOADING AND UNLOADING APPARATUS FOR A COATING DEVICE

(75) Inventors: Holger Juergensen, Aachen (DE); Johannes Kaeppeler, Wuerselen (DE)

(73) Assignee: Aixtron AG (DE)

( * ) Notice: Subject to any disclaimer, the term of this patent is extended or adjusted under 35 U.S.C. 154(b) by 299 days.

(21) Appl. No.: 11/781,779

(22) Filed: Jul. 23, 2007

(65) Prior Publication Data
US 2008/0014057 A1    Jan. 17, 2008

Related U.S. Application Data

(60) Division of application No. 11/038,305, filed on Jan. 19, 2005, now abandoned, which is a continuation of application No. PCT/EP03/07244, filed on Jul. 7, 2003.

(30) Foreign Application Priority Data

Jul. 19, 2002   (DE)   ................. 102 32 731

(51) Int. Cl.
*B05C 13/00*   (2006.01)
*B05C 21/00*   (2006.01)
*C23C 16/00*   (2006.01)
*C23F 1/00*    (2006.01)

(52) U.S. Cl. .............. 118/503; 118/500; 118/719; 156/345.31; 156/345.32

(58) Field of Classification Search ........... 118/719, 118/728, 729, 500, 503; 414/222.01, 222.03–222.08, 414/225.01, 226.04, 935–941; 156/345.31–345.32, 156/345.51
See application file for complete search history.

(56) References Cited

U.S. PATENT DOCUMENTS

| 5,383,971 | A | | 1/1995 | Selbrede ................ 118/728 |
| 5,766,360 | A | * | 6/1998 | Sato et al. ............... 118/666 |
| 6,001,183 | A | * | 12/1999 | Gurary et al. ........... 118/720 |
| 6,217,663 | B1 | | 4/2001 | Inokuchi et al. ........ 118/728 |
| 6,283,273 | B1 | * | 9/2001 | Miyauchi et al. ....... 198/468.8 |
| 6,413,459 | B1 | | 7/2002 | Anderson et al. ...... 264/230 |

FOREIGN PATENT DOCUMENTS

WO      01/57908     8/2001

OTHER PUBLICATIONS

International Search Report: Jan. 26, 2004.

* cited by examiner

*Primary Examiner*—Karla Moore
(74) *Attorney, Agent, or Firm*—St. Onge Steward Johnston & Reens LLC (57) ABSTRACT

A device for loading at least one substrate into a process chamber of a coating unit and unloading the at least one substrate therefrom by means of a gripper of a handling machine. The device includes a loading plate which can be gripped by the gripper and embodies a storage place for each at least one substrate, the storage place being formed by an edge of an opening that is assigned to each substrate. The device also includes a substrate holder that is provided with a pedestal-type substrate support which is adapted to the loading plate and on which the substrate plate can be placed such that some sectors of the surface of the substrate support are located at a certain gap distance from the substrate or the substrate lies in a planar manner on a sector of the surface.

13 Claims, 9 Drawing Sheets

LOADING AND UNLOADING APPARATUS FOR A COATING DEVICE

CROSS-REFERENCE TO RELATED APPLICATIONS

This application is a divisional of U.S. patent application Ser. No. 11/038,305 filed on Jan. 19, 2005, which is a continuation of International Patent Application No. PCT/EP2003/007244 filed on Jul. 7, 2003, which designates the United States and claims priority from German Patent No. 10232731.9 filed on Jul. 19, 2002.

BACKGROUND OF THE INVENTION

The invention relates to an apparatus for loading and unloading a process chamber of a coating device with at least one substrate by means of a gripper and an automated handling unit.

It is known for the substrates which are to be coated to be introduced into the process chamber of a coating device and removed from it again by means of a gripper of an automated handling unit. A CVD process can be carried out in the process chamber. The gripper can act on the substrate directly. By way of example, the gripper may form a tongue which engages beneath the substrate. To unload the apparatus, this tongue has to be moved under the substrate. A gripper of this type can in each case only grip one substrate. Moreover, for the tongue to engage beneath the substrate, the substrate has to be lifted off its supporting surface slightly. For the substrate to be lifted off the substrate holder, the substrate holder has an apparatus, for example in the form of pins, which move out of the substrate surface in order to lift the substrate. An arrangement of this type leads to an inhomogeneity in the supporting surface for the substrate and therefore to undesirable inhomogeneous temperatures on the substrate holder surface or over the substrate. Other methods for temporarily lifting the substrate which have been proposed in the prior art likewise have these drawbacks.

Furthermore, it has been proposed in the prior art to remove not just the individual substrates, but rather the substrates together with the substrate holders, from the process chamber.

Working on the basis of this prior art, the invention is based on the object of improving the loading and unloading of a process chamber with at least one substrate.

This object is achieved by the invention specified in the claims, among which in claim 1 it is provided firstly and substantially that the apparatus has a loading plate which can be gripped by the gripper and forms a supporting location, which is formed by an edge of an opening associated with each substrate, for each at least one substrate. The substrate is therefore located above the opening during loading. The edge of the opening supports the edge of the substrate. In a preferred configuration of the invention, the bottom of the opening is formed by a recess. The substrate is therefore located in a recess. The result of this is that acceleration forces applied to the loading plate cannot displace the substrate out of the supporting location. The opening associated with each substrate may be circular, so that only the edge of the substrate rests on the edge of the opening. The contour of the opening is preferably similar to the peripheral contour of the substrate. If the substrate is substantially circular in form, the opening is likewise circular in form, but with a smaller diameter. If the substrate has a rectangular or polygonal peripheral contour, the opening preferably has the same peripheral contour, but with a smaller diameter. The loading plate per se may have a multiplicity of supporting locations and may have a substantially circular circumferential contour. The supporting plate may have an annular collar on the rear side. The substrate holder may have one or more pedestal-like substrate carriers, on each of which a supporting plate can be placed in such a manner that surface portions of the substrate carrier are at a gap spacing from the substrate or that the substrate rests flat on a surface portion. In the former case, the heat transfer from the heated substrate holder to the substrate is effected by means of thermal radiation. In the latter case, the heat transfer is effected by heat conduction. The annular collar surrounds a receiving cavity for receiving the substrate holder. The substrate carrier may be an integral part of the substrate holder. However, it is preferable for the substrate carrier to be a plate driveable in rotation on a gas bearing. The supporting plate can be fitted onto this plate in such a manner that it rotates with the substrate carrier. The loading plate can be located in a depression in the substrate holder, in such a manner that its surface is flush with the surface of the substrate holder. The material of the loading plate and the material of the substrate holder may be identical or similar. The annular collar may have a conically running inner wall. The substrate carrier, onto which the loading plate can be placed, may form a circumferential formation of matching shape. When the loading plate is being placed on the substrate carrier, a self-centering action of the loading plate is then effected. The outer wall of the annular collar may have a circumferential groove. This circumferential groove may in turn form an annular engagement groove for a hook of the gripper to enter. The gripper may preferably have two gripper arms and a hook. The length of the two gripping arms may be shorter than the diameter of the loading plate, so that as a result of the eccentric engagement of the gripping arms in the circumferential groove of the loading plate a tilting moment is produced when the loading plate is lifted. This tilting moment causes the loading plate to tilt at the moment when it is lifted. As the loading plate tilts, the hook which has been introduced into the circumferential groove moves into the engagement groove in the periphery of the loading plate, so that the latter is securely held by the gripper. To ensure that the gripper, and in particular the arms and the hook, come into contact with the loading plate, the substrate holder has at least three depressions which are open toward the edge. One of these depressions forms a centering opening. This opening may have trapezoidal opening walls. A centering projection of the gripper, with which the hook is also associated, moves into this centering opening. As the centering projection moves into the centering opening, the rotatable substrate holder can be rotated slightly until it has reached its optimum orientation. This is of benefit to positionally accurate placing of the loading plate on the substrate carrier. Two passage-like cut-outs, which are open toward the edge of the substrate holder, are used for engagement of the gripping arms of the gripper during loading and/or unloading of the process chamber with the loading plate. The apparatus may also have an associated removal device. This removal device has vertical supports associated with each opening in the loading plate. The plate can be fitted over these vertical supports. In the process, the vertical supports penetrate through the openings in the loading plates and thereby lift the substrates off the loading plate. The substrates are then located on the vertical supports and can be collected by the same or a different gripper in order to be fed to a cassette or other intermediate loader. The vertical supports may be formed by at least three vertical pins.

The configuration described above provides an automatic loading and unloading system for one or more substrates for a coating device. The loading and/or unloading may take place within a very short time. The operation can take place at process temperatures (400° C. to 1200° C.). This minimizes the times between the actual coating operations. The substrates are removed from cassettes, which can hold a plurality of substrates, and transported into the reactor. After coating has taken place, the substrates are put back in the cassettes. During loading into and unloading from the process chamber, the substrates are not gripped or clamped either on their surface or at their peripheral edges. In particular, there is no contact with the surface of the substrate at any time. The entire operation can take place automatically. A further advantage is that no particles are generated or transported to the substrate surface during loading and unloading.

To load the process chamber with a plurality of substrates, these substrates are first of all, outside the chamber, automatically placed in recesses in a thin loading plate which consists of an identical or similar material to the substrate holder in the chamber. This loading plate is formed in such a way that only the external periphery of the substrates is located in a cut-out in this plate. The bases of these cut-outs form openings, the diameters of which are only slightly smaller than the substrate diameters. This loading plate can be loaded by means of the removal device. For this purpose, the releasable loading plate is first of all fitted over the vertical supports. Then, at least one substrate is placed onto the vertical supports in an accurately positioned manner by means of a robot arm. Then, the loading plate is displaced vertically upward until the substrates are resting on the edge of the openings. Unloading is carried out in the reverse order. The loading plate is then introduced into the process chamber by the gripper. As the centering projection described above moves into the centering opening in the substrate holder, the substrate holder is positioned by means of the centering projection, so that the loading plate can be fitted accurately over the substrate carrier. The substrate carrier may be hotter than the loading plate. Then, however, heat transfer causes the loading plate to be heated up to the temperature of the substrate holder, with length expansion taking place in such a manner that the diameter of the loading plate is increased slightly. On account of the conicity of the inner wall of the annular collar and of the circumferential wall, which is of matching shape, of the substrate carrier, as it heats up the loading plate slips downward into its final position, in which the substrates either rest flat on portions of the substrate carrier or are at a defined gap spacing from the surface of the substrate holder. The gap spacing is defined by the material thickness of the loading plate, which rests flat on the surface of the substrate carrier.

On account of the centering projection, which interacts with the centering opening in the substrate holder, the rotationally driven substrate holder only has to be roughly prepositioned for loading and unloading. Precision positioning is effected by the gripper itself. The retaining of the loading plate on the gripper is effected when the plate is tilted as it is lifted, with a hook engaging in an annular engagement groove in the loading plate. The substantially rotationally symmetrical circumferential contour of the loading plate makes it possible for the latter to be gripped by the gripper independently of its rotational position.

BRIEF DESCRIPTION OF THE DRAWINGS

Exemplary embodiments of the invention are explained below on the basis of appended drawings, in which.

DETAILED DESCRIPTION OF THE DRAWINGS

The apparatus according to the invention is used in a CVD reactor. A reactor of this type has a process chamber in which a defined gas phase composition is set, so that one or more layers are deposited on substrates resting on a substrate holder which forms the base of the process chamber, the layer material being supplied via the gases of the gas phase. The process may be a VPE, MOCVD or, very generally, a CVD process.

The apparatus according to the invention is an auxiliary means for loading and unloading the process chamber with substrates in the form of a loading plate 3 which, having been equipped with substrates 1 before the process, is introduced into the process chamber, where it remains during the coating process, in order to be removed again from the process chamber, together with the substrates, after the coating process has been completed.

The loading plate 3 shown in the exemplary embodiments illustrated in the figures is circular in form. A number of openings 5 are disposed uniformly on the surface of the loading plate 3. The openings 5 are in each case located in recesses, so that they form a recessed edge 4 on which the edge 1' of in each case one substrate 1 can rest. The recesses each form a supporting location 6 for a substrate 1. The circumferential contour of the recess is substantially matched to the circumferential contour of the substrate. In the exemplary embodiment, the circumferential contour of each supporting location 6 is accurately matched to the circumferential contour of the substrate 1. Therefore, the recess, like the substrate, forms a portion which is not round. However, it is provided that the recess has a circular circumferential contour. Then, the opening 5 which forms the bottom of the recess likewise has a circular circumferential contour, the diameter of the opening 5 being smaller than the diameter of the substrate, in order to ensure that the edge of the substrate rests on the edge 4.

On the rear side of the loading plate 3, which is thin in the inner region, the thickness being 1 to 3 mm, in the vicinity of the edge 3" of the loading plate 3, there is an annular collar 9. On its side facing outward, the annular collar 9 forms an annular circumferential groove 18 which, moreover, forms an undercut annular engagement groove 12. The inwardly facing side of the annular collar 9, with a conically running flank, forms the boundary of a receiving cavity. This conical flank 9' can be brought into surface contact with a matching inclined flank of a substrate carrier 8.

In the exemplary embodiment, the substrate carrier 8 forms a pedestal-like elevation and during the process floats on a gas bearing which, moreover, drives the substrate carrier 8 in rotation, so that the loading plate 3 which has been fitted over the substrate carrier 8 rotates with it. In an exemplary embodiment which is not shown, however, the substrate carrier 8 may also be an integral part of the substrate holder 7.

The substrate carrier 8 is located in a depression 11 in the substrate holder 7. It is surrounded by a circumferential groove, into which the annular collar 9 of the supporting plate 3 can move in such a manner that the surface 3' is flush with the surface 7' of the substrate holder 7. However, it is also possible for the surface 3' if appropriate, for fluid dynamics reasons, to be raised with respect to the surface 7.

The diameters of substrate carrier 8 and annular collar 9 are matched to one another in such a manner that at process temperature the underside of the loading plate 3 rests on the top side of the substrate carrier 8.

If a cold loading plate is placed onto a hot substrate carrier 8, the loading plate 3 is subject to thermal expansion and then slips down into its final position.

The material of the loading plate 3 corresponds to the material of the substrate holder 7 or of the substrate carrier 8.

Figure 1:
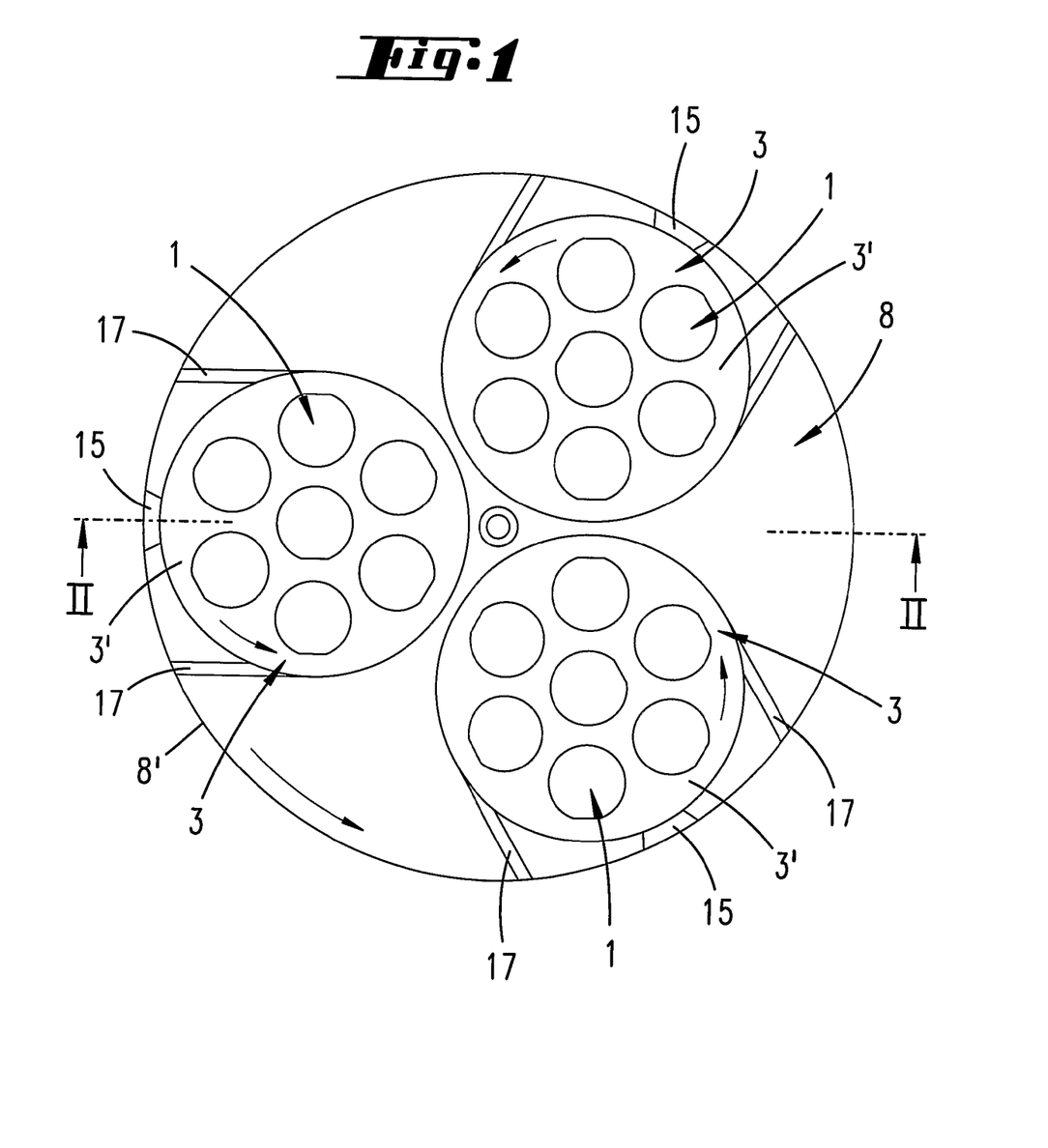
FIG. 1 shows a basic diagrammatic illustration of a substrate holder with a total of three substrate carriers, onto each of which a loading plate with a total of seven supporting locations has been fitted.
Figure 2:
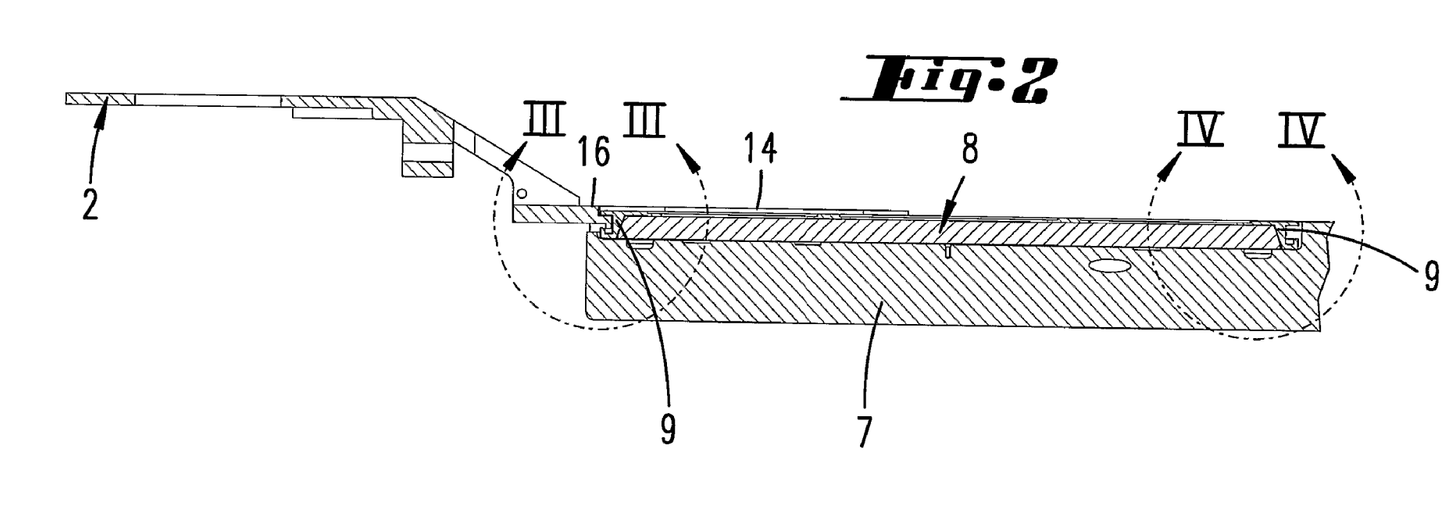
FIG. 2 shows a section on line II-II in FIG. 1.
Figure 3:
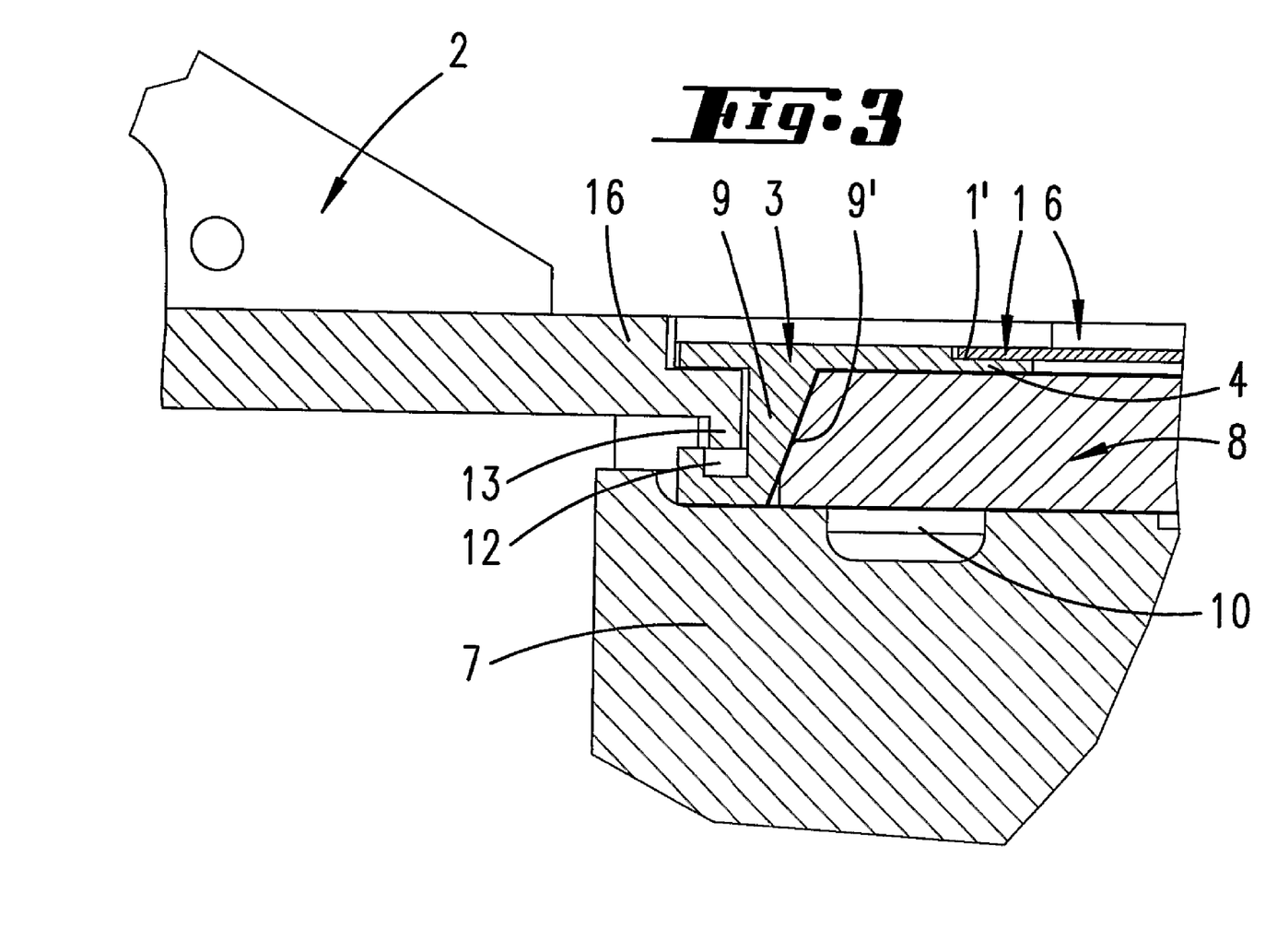
FIG. 3 shows an enlarged illustration of the excerpt denoted by III in FIG. 2.
Figure 4:
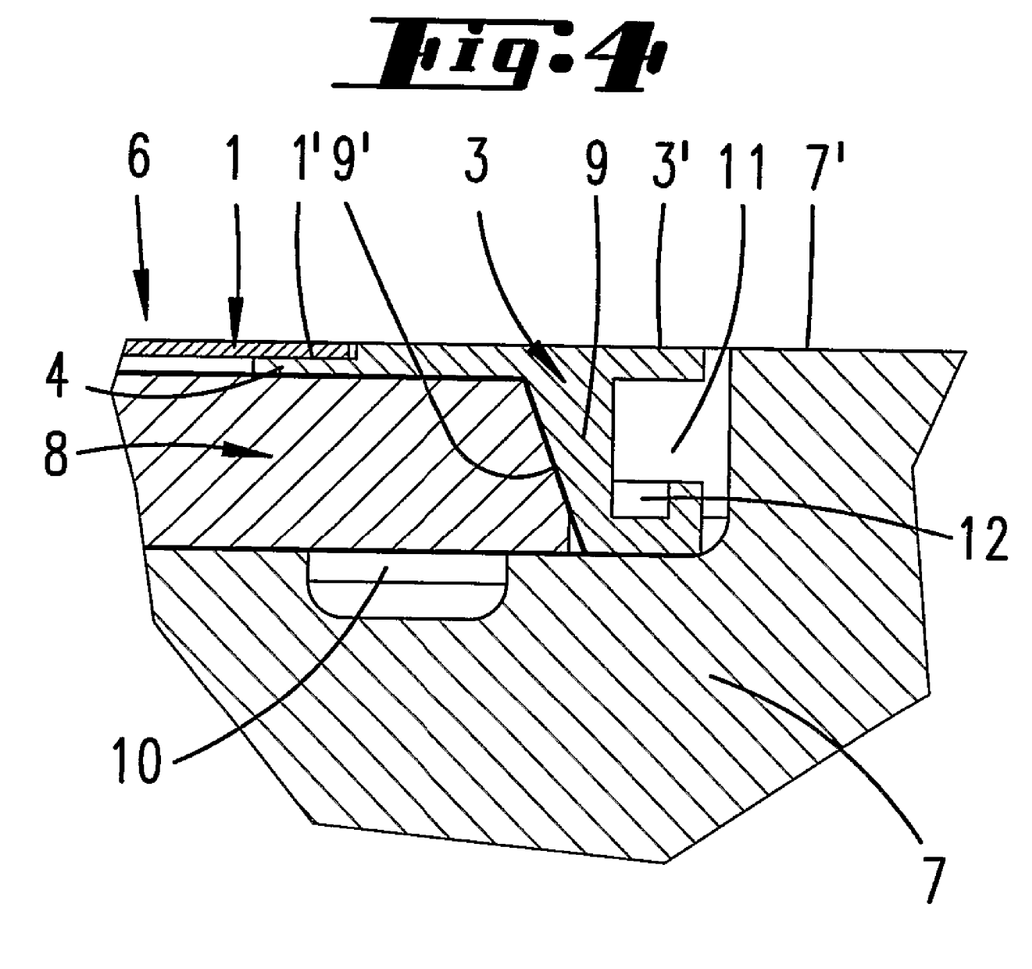
FIG. 4 shows an enlarged illustration of the enlarged excerpt denoted by IV in FIG. 2.
Figure 5:
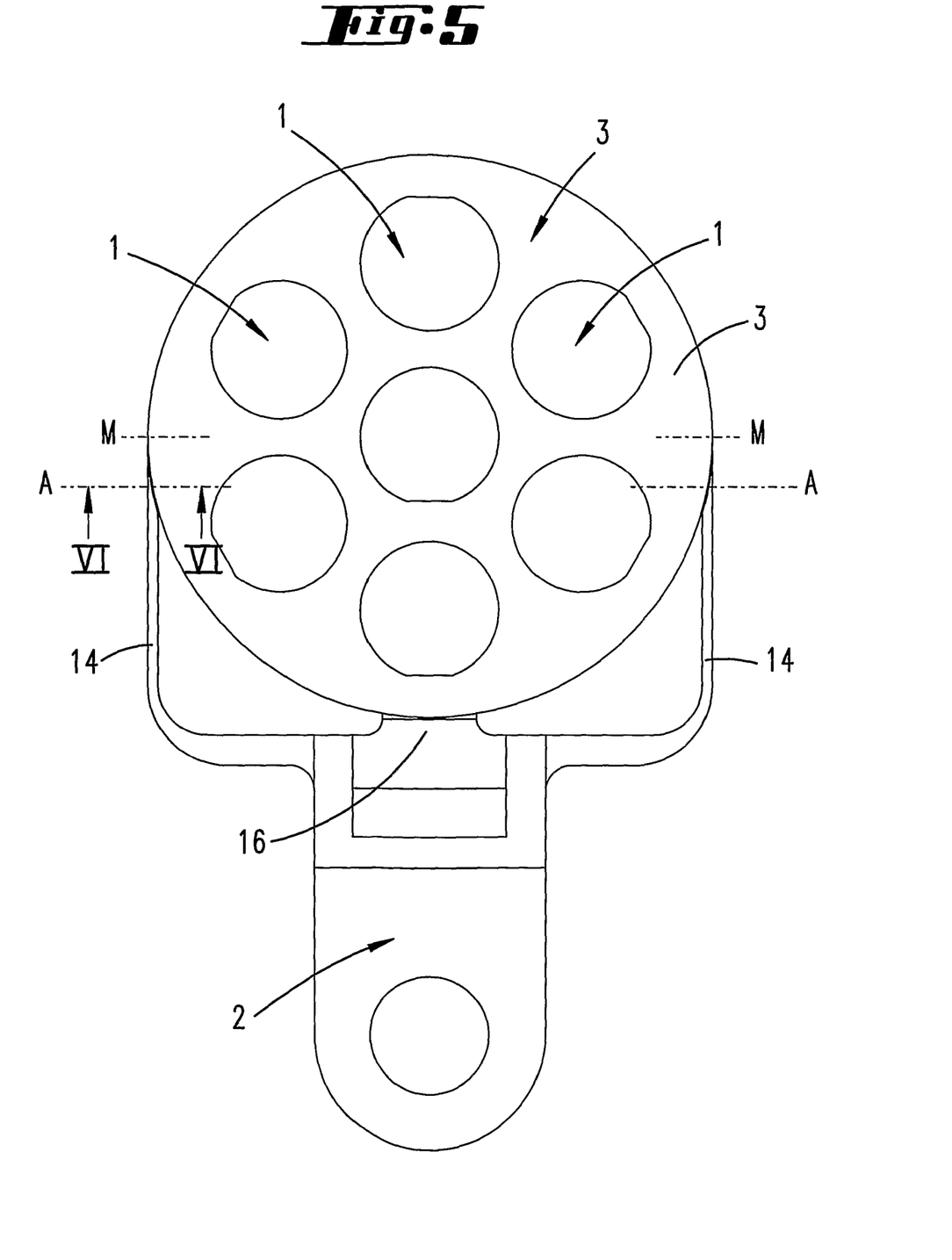
FIG. 5 shows a plan view of a loading plate held by a gripper.

In the exemplary embodiment illustrated in FIGS. 3 and 4, the substrate 1 is located at a gap spacing above the surface of the substrate carrier 8, so that the substrate 1 is heated through thermal radiation.

Figure 10:
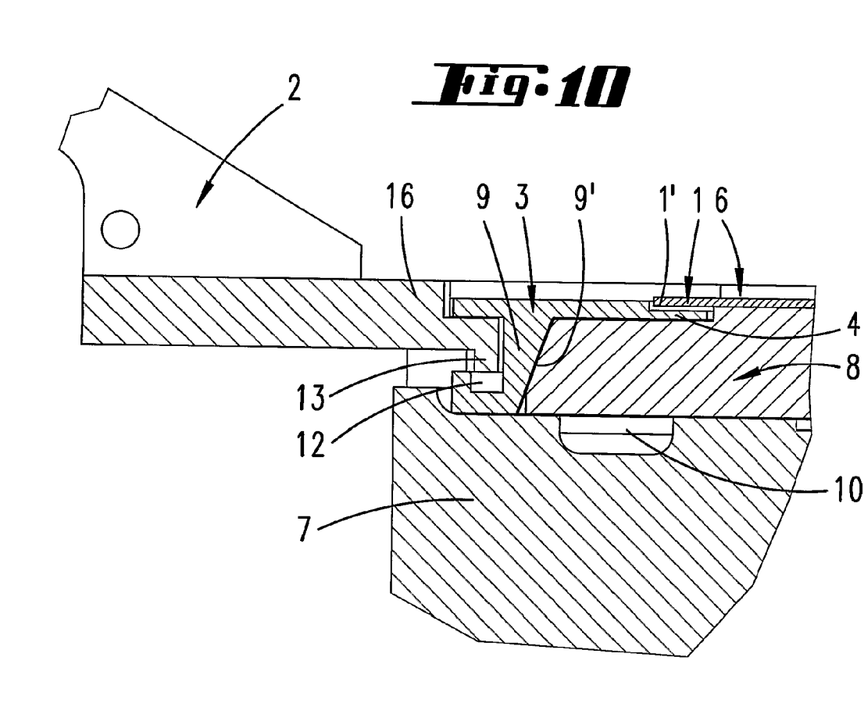
FIG. 10 shows a second exemplary embodiment of the invention in an illustration corresponding to FIG. 3.
Figure 11:
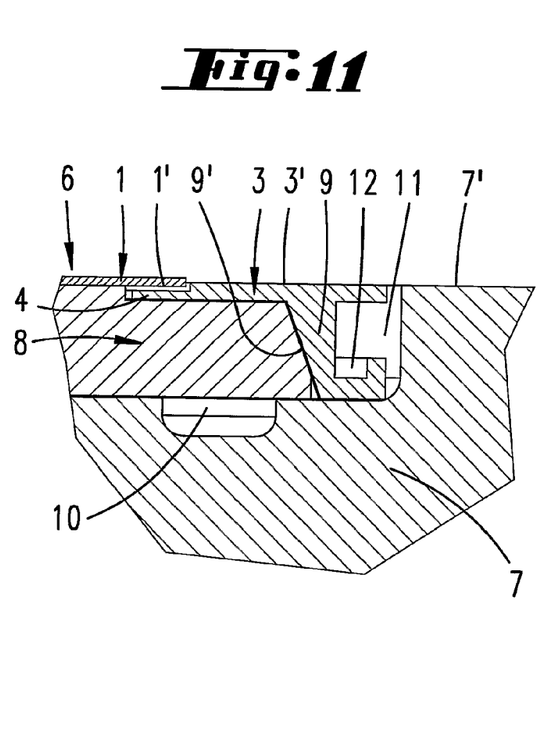
FIG. 11 shows the second exemplary embodiment of the invention in accordance with FIG. 4.

In the exemplary embodiment illustrated in FIGS. 10 and 11, the substrate carrier 8 has a central elevation, on which the substrate 1 rests areally. When the loading plate 3 is being placed onto the substrate carrier 8, the substrate 1 is lifted slightly above the edge 4 of the supporting location 6. However, its edge can still be enclosed by the edge of the recess.

Figure 6:
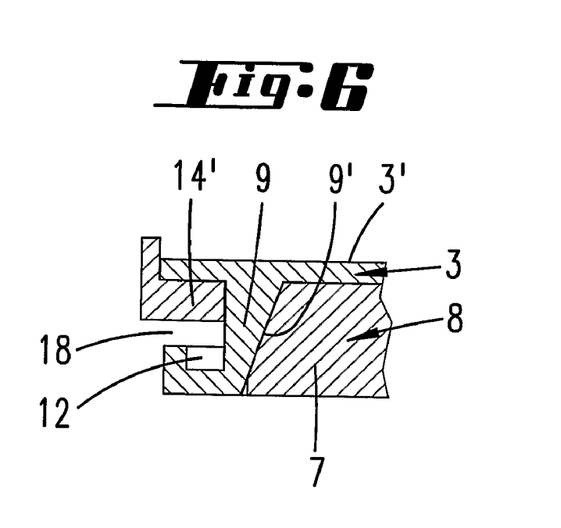
FIG. 6 shows a section on the line VI-VI in FIG. 5.
Figure 7:
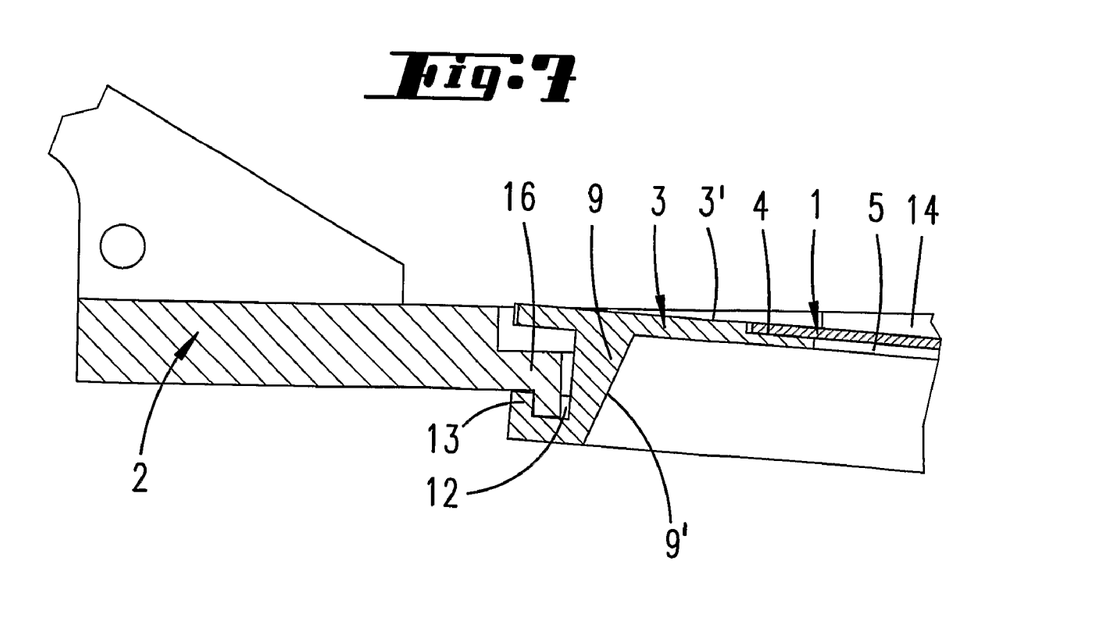
FIG. 7 shows an illustration corresponding to FIG. 3 with the loading plate lifted off the gripper.
Figure 8:
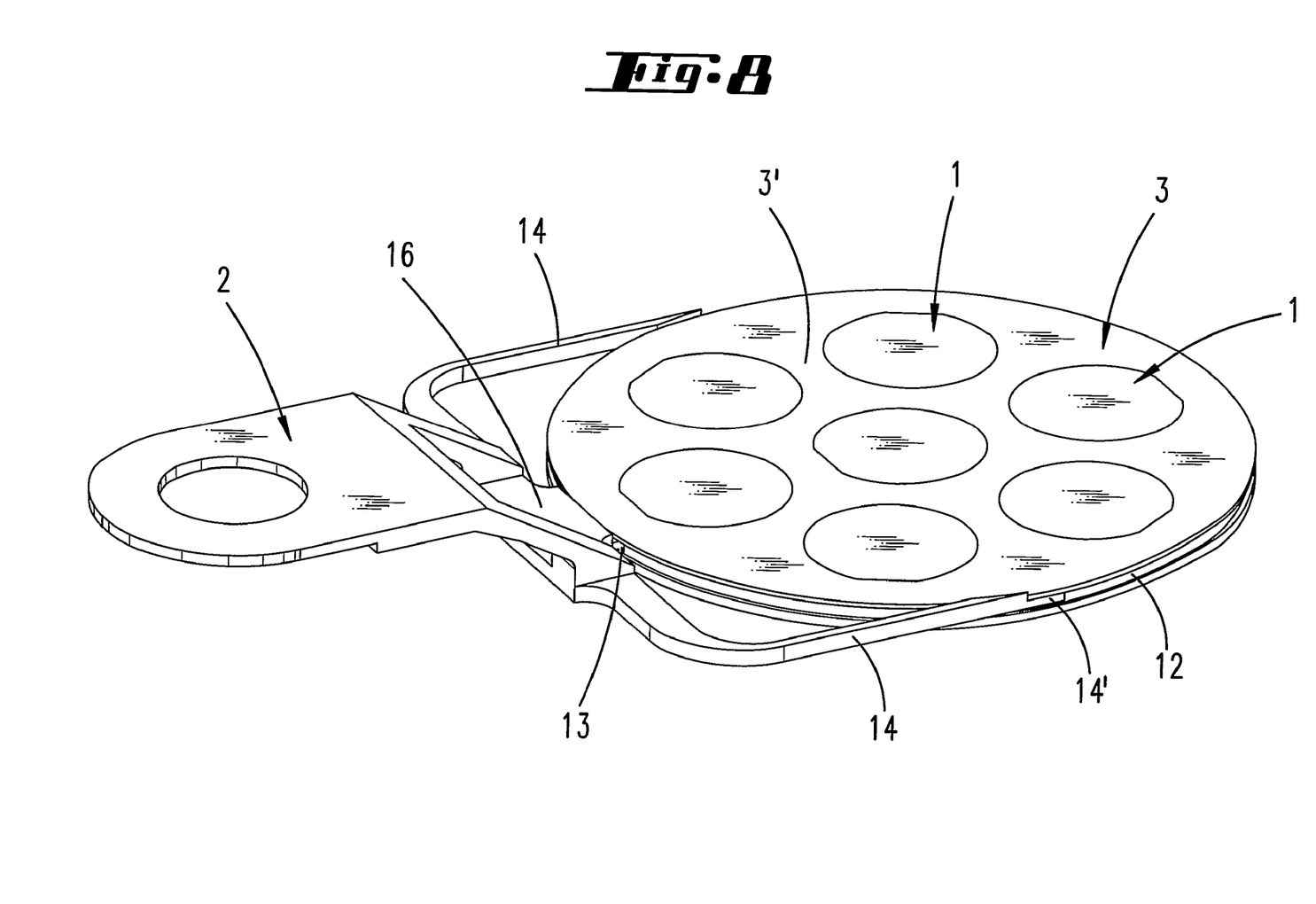
FIG. 8 shows a perspective illustration of the loading plate held by a gripper.

The loading and unloading are carried out using a gripper 2. This gripper has two fork-like gripping arms 14 which can engage, by means of gripping sections 14', in the said annular circumferential groove 18 (cf. FIG. 6). Consequently, the gripping arm 14 can engage beneath the outer edge 3" of the loading plate 3 in order to lift the loading plate 3 out of its position in the depression 11 in the substrate holder 7. For this purpose, the gripping arms 14 project into passages 17 in the substrate holder 7 which are open toward the edge. A centering opening 15 is located between the two passages 17. The centering opening 15 has a trapezoidal outline contour with inclined walls. As the gripper 2 is being moved in, a centering projection 16 penetrates into this opening 15 which is open for centering purposes. A hook 13 is formed integrally on this centering projection 16. This hook 13 enters the annular circumferential groove 18.

To move the substrate holder 7 into the correct rotary orientation, it has ribs/grooves, which can be optically scanned, on its circumferential surface. This means that the centering is possible not only by mechanical means but also by optical means.

The length of the gripping arms 14 is shorter than the diameter of the loading plate 3. Therefore, the axis A, which is defined by engagement of the gripping portions 14' on the loading plate 3, is located eccentrically with respect to the diagonal M, so that a tilting moment occurs when the loading plate 3 is lifted. The tilting of the loading plate 3 causes the hook 13 to engage in the annular engagement groove 12. As a result of this engagement, the loading plate 3 cannot slip out of the gripper 2 when the gripper executes translational movements.

Figure 9:
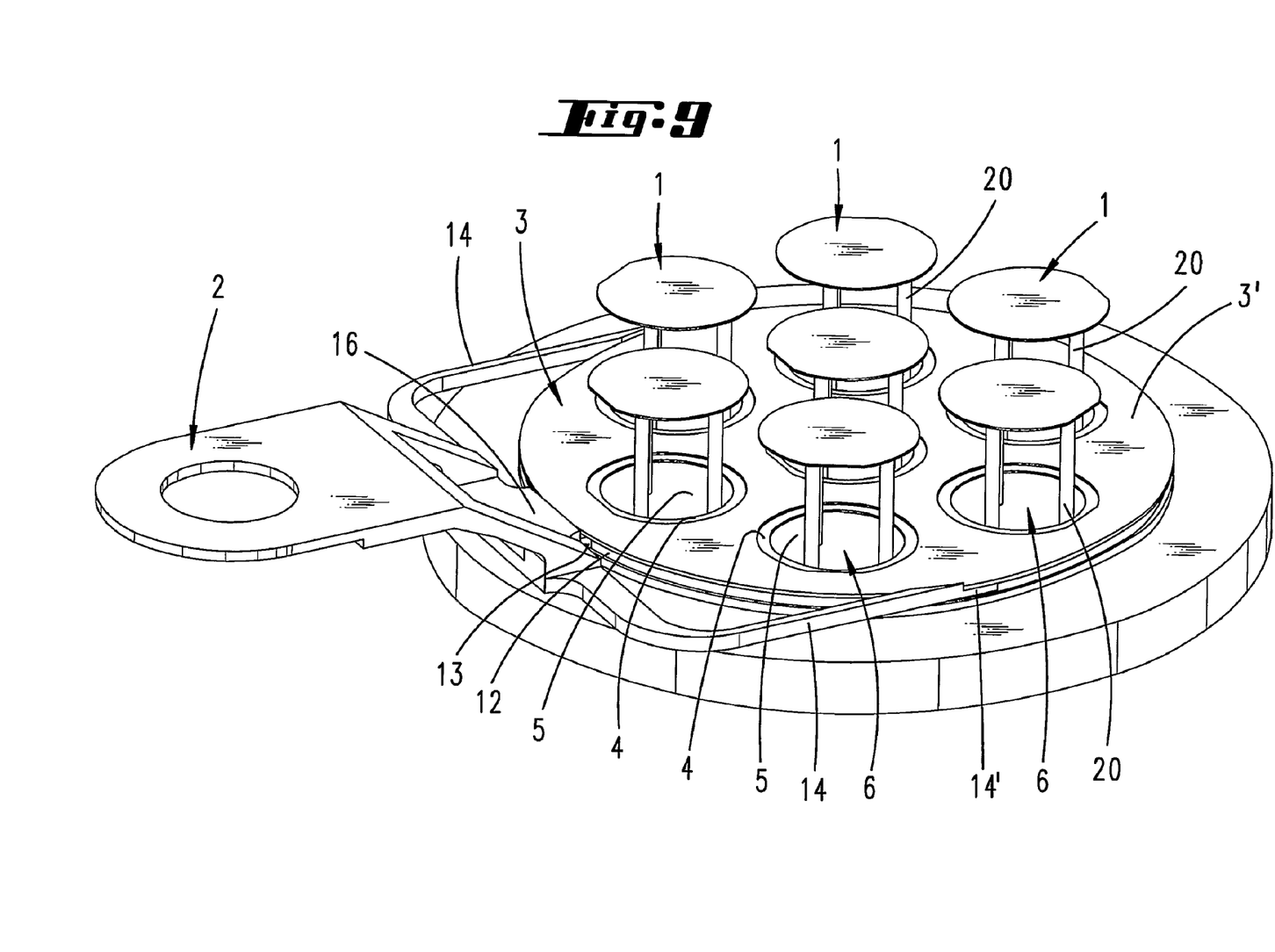
FIG. 9 shows a removal device with a loading plate fitted over vertical pins of the removal device.

The substrates 1 are picked up and put down with the aid of a removal device 19 indicated outside the process chamber. This removal device 19 is substantially a plate which is disposed in the horizontal plane and from which a multiplicity of vertical supports project. Each vertical support comprises a total of three vertical pins 20. These three vertical pins 20 in each case penetrate through one opening 5 defining a supporting location 6. If the loading plate 3 is fitted over the vertical pins 20 in this way, the substrates are lifted out of their supporting locations 6 and, in the position illustrated in FIG. 9, can be gripped by other grippers in order to be fed to cassettes or the like. The loading of the loading plate 3 with substrates takes place in the reverse order. The substrates are placed onto the vertical pins 20 by means of a gripper (not shown) in such a manner that they are aligned above the supporting locations 6. If the gripper 2 is then raised in the vertical direction, the substrates 1 move into the supporting locations 6.

In an exemplary embodiment which is not shown, the substrate holder has only one substrate carrier 8, which is in the form of a pedestal. The material of this substrate carrier 8 may also be joined integrally with the substrate holder 7. In this configuration too it is provided that the substrate holder 8 as a whole be driven in rotation.

In a further exemplary embodiment of the invention which is not illustrated, it is provided that the loading plate 3 has only a single opening 5 for a single substrate.

It is also possible for a purely mechanical drive to be used to drive the substrate carrier in rotation. By way of example, the substrate holder may include a planetary gear mechanism with a toothed ring, which has an internal toothing and extends close to the edge, and a central, externally toothed sun wheel which is driveable in rotation, the two toothings meshing with planet wheels, and a substrate carrier being associated with each planet wheel.

The apparatus according to the invention is suitable for the production of all compound semiconductors, in particular for processes for producing silicon semiconductors for high-k, ferroelectric and other silicon processes. The apparatus is suitable in particular for the production of displays. The apparatus can be used together with one or more robots for loading and unloading a reactor. It is possible to use both rectangular and round substrates. The apparatus can be used with various automated handling units and their grippers. It is also possible for a metal, silicon oxide, graphite, molybdenum or other suitable material to be used as material for the loading plate. The apparatus can be operated at high temperatures (over 1000°) and at low temperatures (below 600°) and at high and low process chamber pressures (0.1 to 1000 mbar). The apparatus is distinguished by the fact that very short loading times are possible. By way of example, the process chamber does not need to be completely cooled during loading. The automated handling unit can be docked to the substrate holder under mechanical or optical control. The robot can interact with a plurality of process chambers. By way of example, the loading plate can be removed from one process chamber and fed to another process chamber. It is also provided that an empty loading plate can be cleaned in a special apparatus. However, the cleaning of the loading plate may also take place in a process chamber. The cleaning can be carried out, for example, by etching. The substrates can be transported, together with the loading plate, from one process chamber into other process chambers or into an intermediate position. The apparatus can also be used in combination with inspection devices, such as FTIR or ellipsometry.

The apparatus is in very general terms suitable for any CVD process and also for any condensation coating process. It can be used for the deposition of metals, insulators, semiconductor layers formed from the elements of groups IV, III-IV, II-V and from organic materials. Suitable substrate materials are any type of solids, in particular silicon, III-V semiconductors, II-VI semiconductors or insulators, such as glass. In particular plastic for display production can be used as substrate. A condensation process is used especially for the production of displays.

All features disclosed are (inherently) pertinent to the invention. The disclosure content of the associated/appended priority documents (copy of the prior application) is hereby incorporated in its entirety in the disclosure of the application, partly with a view to incorporating features of these documents in claims of the present application.

What is claimed is:

1. An apparatus for loading and unloading a process chamber of a coating device with at least one substrate, the apparatus comprising:
   a gripper attached to an automated handling unit, the gripper having two fork-like gripping arms with a gripping section, and a centering projection located between the gripping arms;
   a loading plate with an annular circumferential groove which can be gripped by the gripper;
   a supporting location formed by an edge of an opening in the loading plate associated with each substrate, for each at least one substrate; and
   a removal device, which interacts with the loading plate, including vertical supports associated with each opening, over which supports the loading plate can be fitted in order for the substrates to be removed from the loading plate;
   wherein the centering projection of the gripper and the gripping section of each fork-like gripping arm engages the annular circumferential groove of the loading plate in order to lift the loading plate.

2. The apparatus according to claim 1, wherein the vertical supports include at least three vertical pins.

3. The apparatus according to claim 1, wherein one or more robots are associated with the apparatus.

4. The apparatus according to claim 1, wherein a plurality of process chambers are associated with the apparatus, it being possible for the substrates, resting on a loading plate, to be moved from one process chamber into another process chamber.

5. The apparatus according to claim 1, further comprising analysis devices including at least one of an FTIR device and an ellipsometry device.

6. The apparatus according to claim 1, further comprising one or more cooling and/or heating stations.

7. The apparatus according to claim 1, further comprising an orientation station for orienting the loading plate.

8. The apparatus according to claim 1, further comprising a substrate holder including rotation monitoring grooves for determining a rotational speed and a rotary position of the substrate holder.

9. The apparatus according to claim 1, further comprising a base-like substrate carrier in the process chamber for receiving said loading plate.

10. The apparatus according to claim 9, further comprising a receiving recess integrally formed on the rear of said loading plate, said receiving recess surrounded by an annular collar comprising a conically extending inner wall, and said base-like substrate carrier further comprising a circumferential wall which is of a matching shape.

11. The apparatus according to claim 10, further comprising a substrate holder located in the process chamber, said substrate holder having at least one depression in which the base-like substrate carrier is located, wherein the base-like substrate carrier is surrounded by a circumferential groove into which the annular collar of the loading plate is placed.

12. The apparatus according to claim 11, wherein the substrate holder includes passages which are open towards the edge of the substrate holder, wherein the gripping arms of the gripper are able to project into said passages.

13. The apparatus according to claim 12, wherein the substrate holder includes a center opening between said passages, said center opening having a trapezoidal outline for receiving said centering projection.

* * * * *